United States Patent [19]

Hsieh et al.

[11] Patent Number: 5,441,902
[45] Date of Patent: Aug. 15, 1995

[54] METHOD FOR MAKING CHANNEL STOP STRUCTURE FOR CMOS DEVICES

[75] Inventors: Shiow-Ming Hsieh, Plano; Ching-Yuh Tsay, Richardson; William R. McKee, Plano, all of Tex.

[73] Assignee: Texas Instruments Incorporated, Dallas, Tex.

[21] Appl. No.: 116,103

[22] Filed: Sep. 2, 1993

Related U.S. Application Data

[63] Continuation of Ser. No. 737,733, Jul. 31, 1991, abandoned.

[51] Int. Cl.$^6$ .................................... H01L 21/265
[52] U.S. Cl. ............................ 437/34; 437/57; 437/69; 437/70; 257/369
[58] Field of Search .................. 437/34, 57, 69, 70; 257/369

[56] References Cited

U.S. PATENT DOCUMENTS

| 4,346,512 | 8/1982 | Liang et al. | 437/34 |
| 4,728,619 | 3/1988 | Pfiester et al. | 437/70 |
| 5,091,332 | 2/1992 | Bohr et al. | 437/69 |

FOREIGN PATENT DOCUMENTS

| 0035938 | 3/1983 | Japan | 437/70 |
| 0071646 | 4/1986 | Japan | 437/70 |
| 0256147 | 10/1989 | Japan | 437/70 |
| 0260841 | 10/1989 | Japan | 437/70 |
| 8202283 | 7/1982 | WIPO | 437/70 |

OTHER PUBLICATIONS

ULSI Fabrication, Sorab K. Ghandhi, 1938, pp. 358–362.

Primary Examiner—Olik Chaudhuri
Assistant Examiner—Long Pham
Attorney, Agent, or Firm—Peter T. Rutkowski; Richard L. Donaldson; William E. Hiller

[57] ABSTRACT

In a semiconductor device having two N type regions separated by a P type region, a channel stop is needed to prevent shorting between the two N type regions. The channel stop of the invention has oxide isolators over the two N type regions and a P+ type diffusion lying between the oxide isolators in the P type region. When the N type regions are phosphorus doped deep N− regions biased at different potentials and the P type region is a boron doped P− region, a shallow P+ boron region within the P− region acts as a blocking mechanism to prevent phosphorus from piling up at the semiconductor surface and shorting the two N− regions. The channel stop may be manufactured without adding additional steps to a CMOS process flow. The oxide isolators may be formed when the oxide isolator over the inverse moat separating the P tank and the N tank is created. The P+ region within the channel maybe formed when the sources and drains for transistors within the N tank are formed.

7 Claims, 12 Drawing Sheets

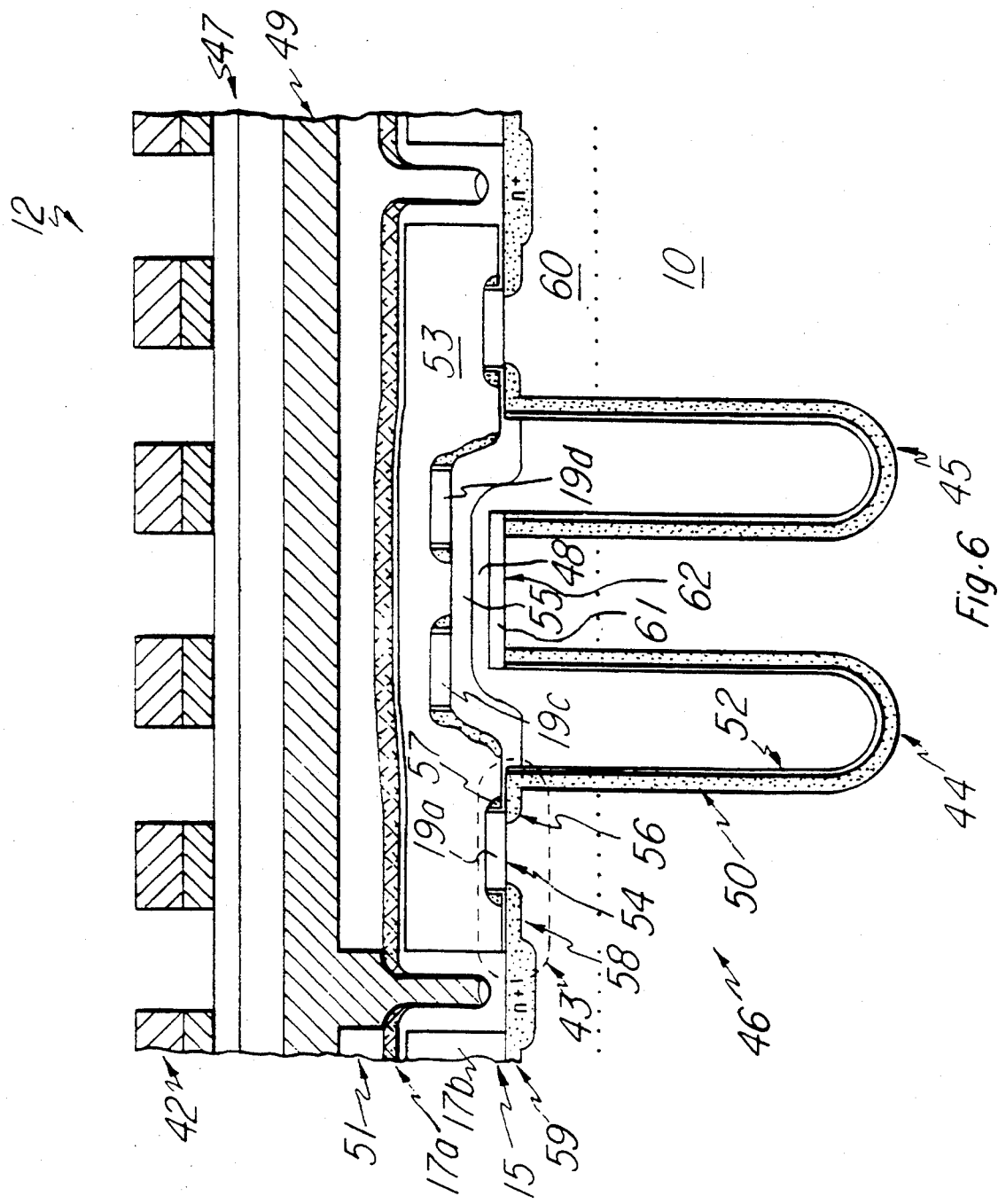

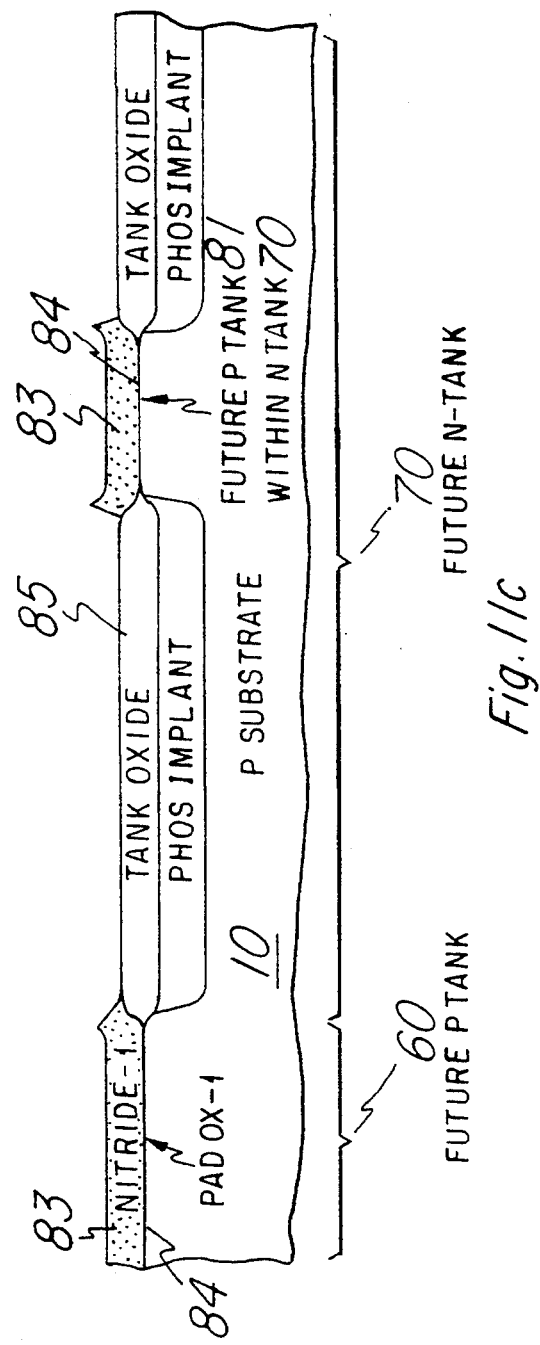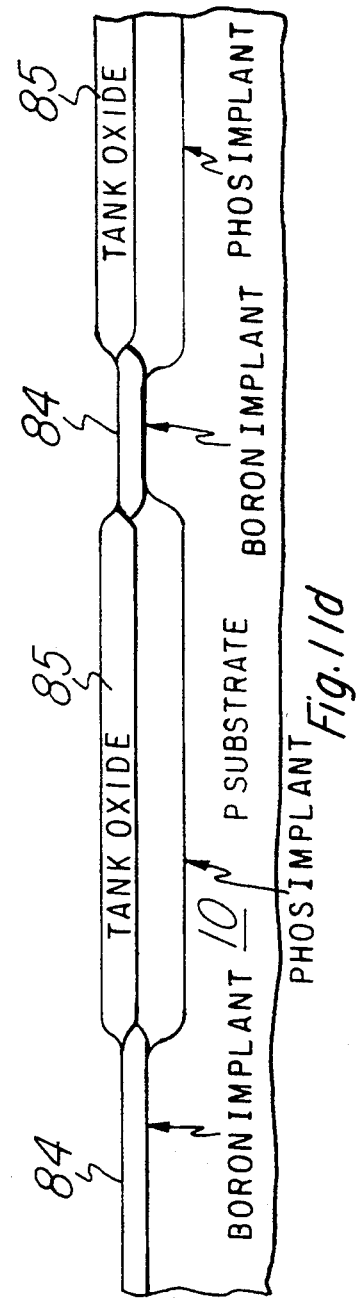

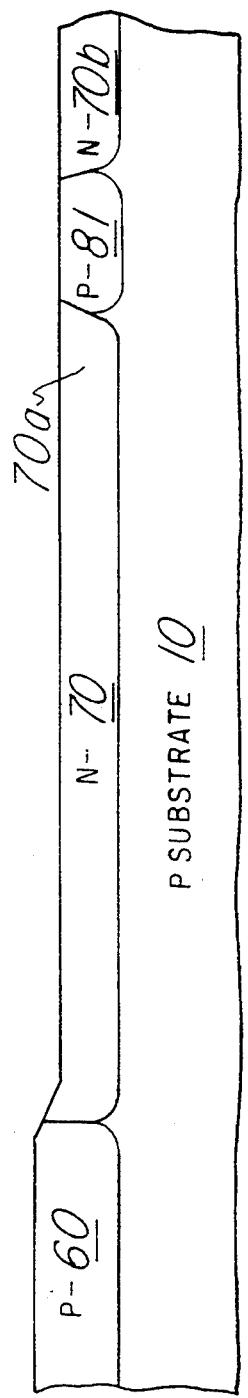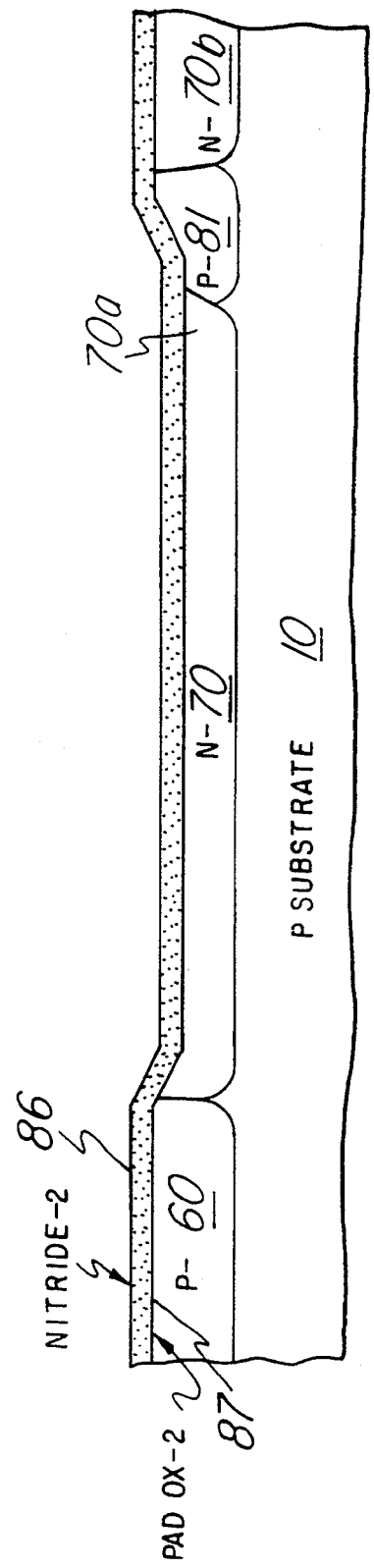

METHOD FOR MAKING CHANNEL STOP STRUCTURE FOR CMOS DEVICES

This application is a continuation of application Ser. No. 07/737,733, filed Jul. 31, 1991, now abandoned.

FIELD OF THE INVENTION

This invention relates to integrated semiconductor devices and more particularly to Complementary Metal Oxide Semiconductor, CMOS, devices.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al, (a trench capacitor cell).

Complementary metal oxide, CMOS, semiconductor technology has been incorporated into the design of DRAM circuitry. Among other advantages, CMOS technology aids in reducing the power consumed by the DRAM device. U.S. Pat. No. 5,017,506 issued to Shen, Yashiro, McKee, and Chung, on May 21, 1991 describes a process suitable for manufacturing high density CMOS type 16M DRAMS.

In CMOS technology, it is common to create two separate tanks. A P tank and an N tank may be created on a semiconductor substrate by doping two regions of the substrate with different dopants. A field oxide may be grown on the semiconductor substrate at the intersection of the two dopants to separate the tanks from each other. Each tank contains circuits and the circuits within each tank may be further isolated from each other. For example, circuits within the N tank may be isolated from each other by forming a P tank between the N tanks and covering the P tank with a field oxide.

In manufacturing high density CMOS products such as DRAMs, it becomes difficult to isolate circuits within one of the tanks from each other. In the example of separating circuits within the N tank by a P tank, the standard CMOS process first forms the P tank and then forms the field oxide it. When this field oxide is grown, the segregation coefficient tends to drag the P tank dopant (boron e.g.) into the oxide and reject the N tank dopant (phosphor e.g.). The phosphor dopant may then laterally diffuse across the top of the P tank near the surface of the semiconductor chip. This can result in electrical shorting between the N tanks.

It is an object of this invention to provide a blocking mechanism for CMOS devices to prevent tank shorting. It is a further object of this invention to provide a channel stop structure for high density DRAM memory devices.

Other objects and advantages of this invention will be apparent to those of ordinary skill in the art having reference to the following specification and drawings.

SUMMARY OF THE INVENTION

The invention places a channel stop on a semiconductor substrate having two N− type regions separated by a P− type region. The channel stop prevents shorting between the two N type regions by placing oxide isolators over the two N type regions and by placing a P+ type diffusion lying between the oxide isolators in the P− type region. Whet the N type regions are phosphorus doped deep N− regions biased at different potentials and the P− type region is boron doped P− region, a shallow P+ boron diffusion in the P− region acts as a blocking mechanism to prevent phosphor from piling up at the semiconductor surface and shorting the two N− regions. The oxide isolators may be formed when the oxide isolator over the inverse moat separating the P tank and the N tank of a CMOS device is created. The P+ region within the channel may be formed when the sources and drains for transistors within the N tank are formed. The inventive process thus forms a channel stop blocking mechanism without adding extra process steps to a CMOS process flow.

BRIEF DESCRIPTION OF THE DRAWINGS

FIG. 6 is a side view of the memory cells.

FIGS. 11a–11i are side views of the peripheral structure illustrating successive stages in the manufacture thereof.

DETAILED DESCRIPTION OF THE PREFERRED EMBODIMENT

Figure 1:
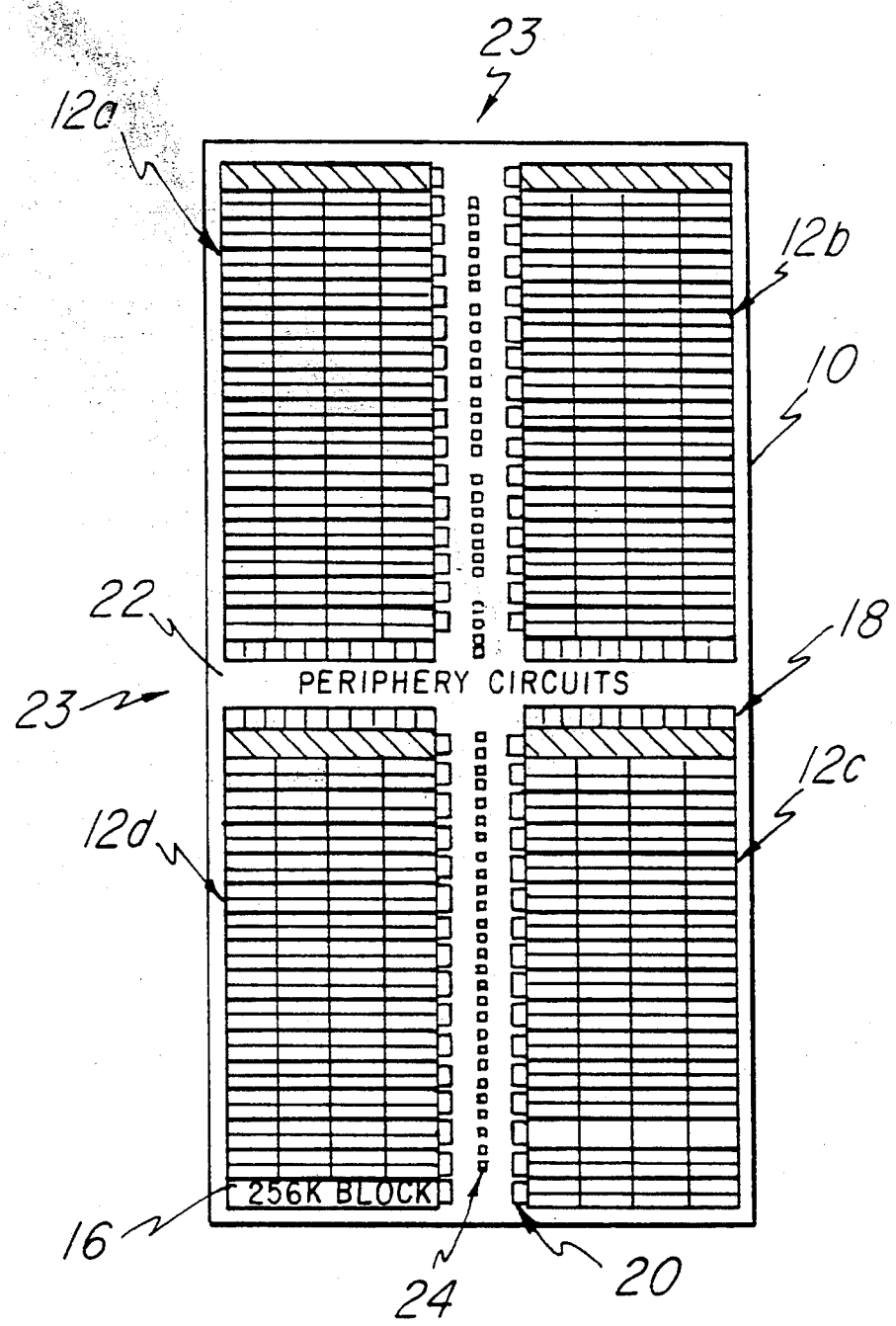
FIG. 1 is a block system level drawing illustrating a semiconductor integrated circuit device on a substrate incorporating the preferred embodiment of the invention.

Referring to FIG. 1, a semiconductor memory device is shown that may incorporate the preferred embodiment of the invention. The illustrative semiconductor memory device is a 16M DRAM dynamic random access memory having a memory array 12 formed in an active face of semiconductor silicon substrate 10. A submicron process such as disclosed in U.S. Pat. No. 5,017,506 issued May 21, 1991 and assigned to Texas Instruments Incorporated may produce such a memory device on a semiconductor chip size of about 327×660 mils.

With reference to the 16M dynamic memory illustrated in FIG. 1, generally, the memory array 12 is partitioned into four memory quadrants 12a–12d of 4 Megabits each. Each memory quadrant 12a–12d contains sixteen memory blocks 16 of 256 Kilobits each. Each memory block 16 contains 2048 bit lines 17, or columns, contains 1024 sense amplifiers, and has 256 word lines 19, or rows. (The bit lines, word lines, and sense amplifiers are not illustrated in FIG. 1 for clarity.) The column decoders 18 lie along the vertical axis 23 of the chip adjacent to their respective memory array quadrants. The row decoders 20 lie along the horizontal axis 25 of the chip adjacent to their respective memory array quadrants. The periphery circuits 22, containing such devices as the input and output buffers and the timing and control circuits, are formed in the periphery of the substrate and are centrally located along the vertical axis of the chip while the bond pads 24 are centrally located along the horizontal axis of the chip. Although not illustrated in FIG. 1 for clarity, the DRAM receives addresses signals A0–A11 and its operation is controlled by the standard signals Row Address Strobe RAS_, Column Address Strobe CAS_, and Write Enable W_.

Figure 2:
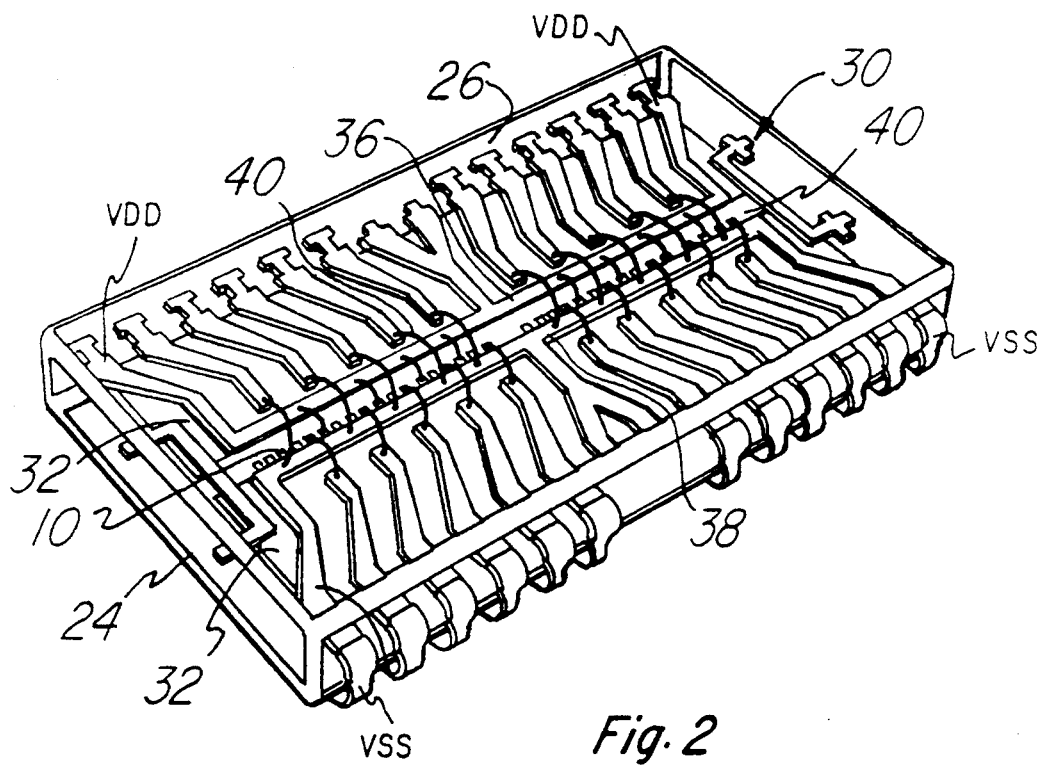
FIG. 2 is a three dimensional view of the packaged, encapsulated, semiconductor integrated circuit device wherein the encapsulant is rendered transparent.
Figure 3:
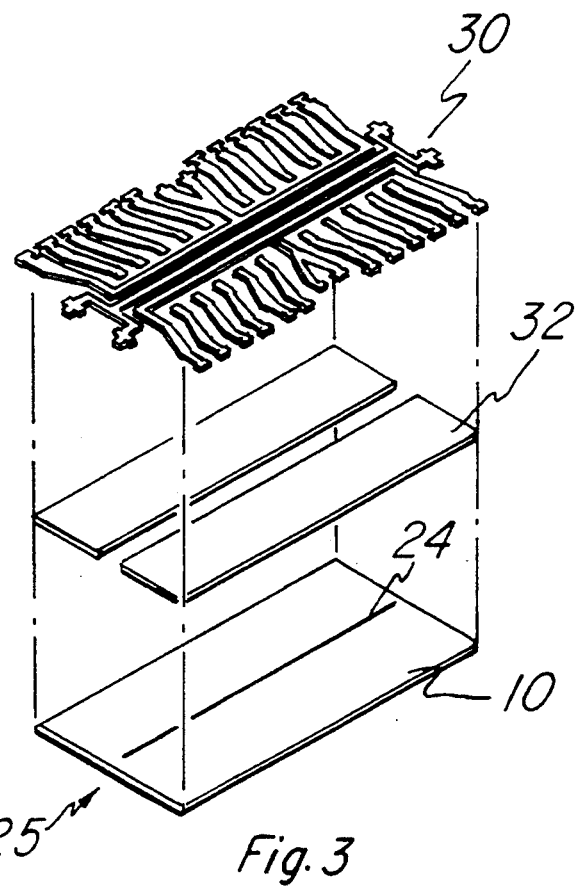
FIG. 3 is a partial assembly view of FIG. 2.

FIG. 2 depicts a three dimensional view of the encapsulated chip 10 wherein the encapsulant 26 is rendered transparent while FIG. 3 presents an assembly view. The chip 10 is encapsulated in a thin plastic small outline J-type package of the lead over chip center bond (LOCCB) type. The chip 10 underlies the lead frame 30. Two strips of polyimide tape 32 attach the chip 10 to the lead frame 30. The two strips of tape 32 are positioned along the horizontal axis 25 of chip 10 on opposite sides of the bond pads 24 leaving the bond pads uncovered and exposed. When assembled, the bond pads 24 lie between the Vdd power supply bus 36 and the Vss power supply bus 38 of the lead frame 30. Various wire bonds 40 attach the Vdd power supply bus 36 and the Vss power supply bus 38 to various of the bond pads 24 allowing multiple connections from the power supply busses to the semiconductor chip 10. Other wire bonds, such as wire bond 40a, cross over the power supply busses and attach the lead fingers 40 to the bond pads 24. These crossing wire bonds do not touch the power supply busses and no shorting occurs.

Figure 4:
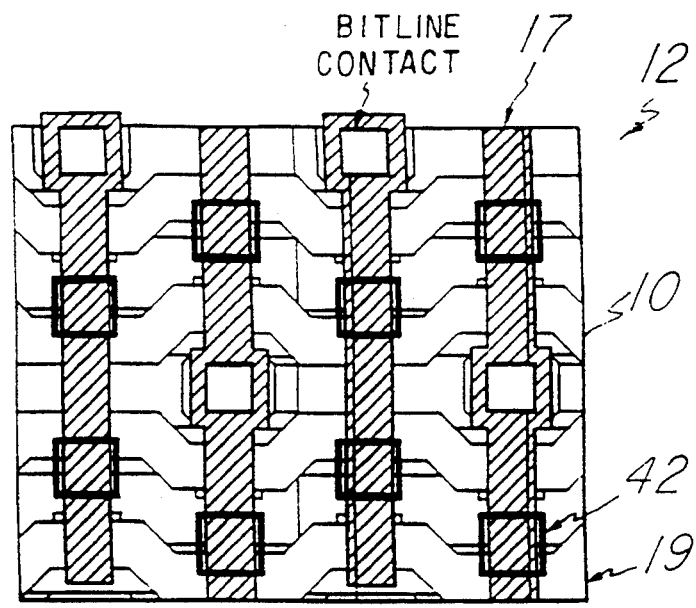
FIG. 4 is a top view of a portion of the memory array layout of the semiconductor integrated circuit device.

FIG. 4 is a top view of a portion of memory array 12. The memory cells are of the trench capacitor type and are laid out in a double word line pitch. The bit lines 17 are polycide and are triple twisted for improved noise immunity. The word lines 19 are polysilicon and are strapped every 64 bits. Strapping the word lines reduces word line resistance. However, strapping the word lines also creates areas of discontinuity within the memory array as is later explained.

Figure 5:
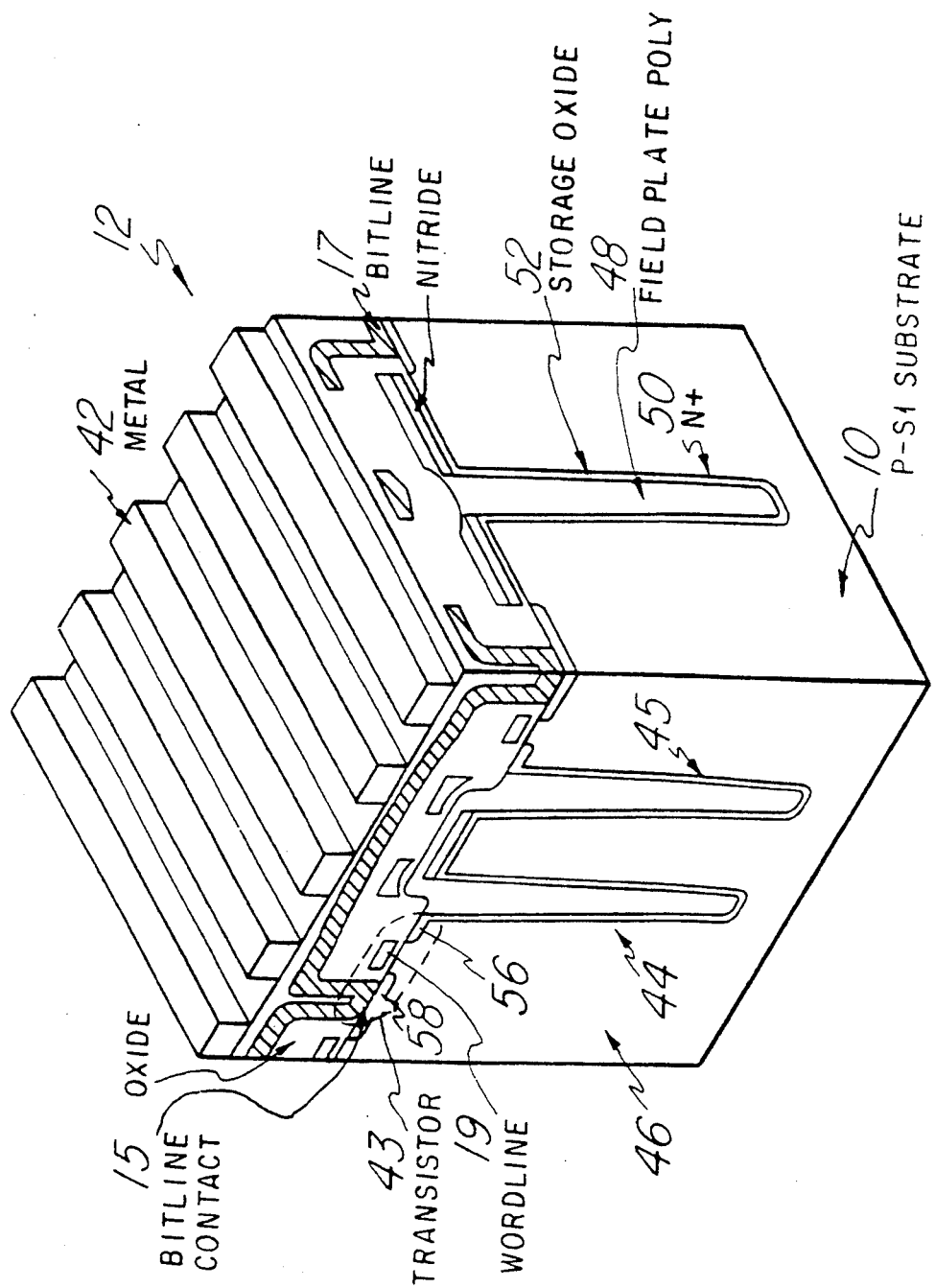
FIG. 5 is a cross sectional view of the memory cells of the memory array.

FIG. 5 presents a three dimensional view of a portion of the memory array 12 while FIG. 6 presents a cross section view. An interconnect metal layer 42 accomplishes word line strapping. It is a second level of metal and may accordingly be referred to as metal-2. An oxide layer 47 separates metal layer 42 from a metal layer 49. Metal layer 49 is a multi level interconnect metal that accomplishes contacts to the bit lines. It is a first level of metal and may accordingly be referred to as metal-1. An oxide layer 51 lies below interconnect metal 49 to provide isolation between the silicided bitlines 17 and metal layer 49. The bit lines 17 comprise a layer of titanium silicide 17a overlying a layer of polysilicon 17b. They have a pitch, or width, or about 1.6 microns. An oxide layer 53 lies beneath the bit lines 17 and lies over the word lines 19. The word lines 19 have a submicron width of about 0.6 microns. Word line 19a forms the gate of pass transistor 43. It is separated from the substrate 10 by an oxide layer 54. Word lines 19i c and 19d pass over the top trench capacitors 44 and 45 and connect to other trench capacitors not shown. They are separated from the polysilicon field plate 48 by an oxide layer 55. The word lines 19 have side walls 57 of nitride. An N+ diffusion 59 lies in the P-tank 60 underneath the bit line contacts 15 and between word line 19a and trench capacitor 44. The N+ diffusion 59 thus forms the source 56 and the drain 58 of the pass gate transistor 43. Underneath field plate 48, between the trench to trench space separating trench capacitors 44 and 45, lies a nitride layer 61. Between nitride layer 61 and P-tank 60 lies an oxide layer 62. It acts as a buffer layer between the silicon substrate 10 and the nitride layer 61 and is part of the field plate isolating dielectric. The trench capacitors 44 and 45 extend through openings in the field plate 48, through the P-tank 60, and into the P substrate of the silicon wafer 10 about 6 microns. A layer 50 of implanted arsenic outside the trench capacitor walls creates the N+ storage node of the capacitors. The trench capacitor walls contain a layer 52 of oxide and nitride that acts as a dielectric layer between the arsenic trench wall implant and the polysilicon field plate 48. Transfer transistor 43 and trench capacitor 44 comprise memory cell 46.

Figure 7:
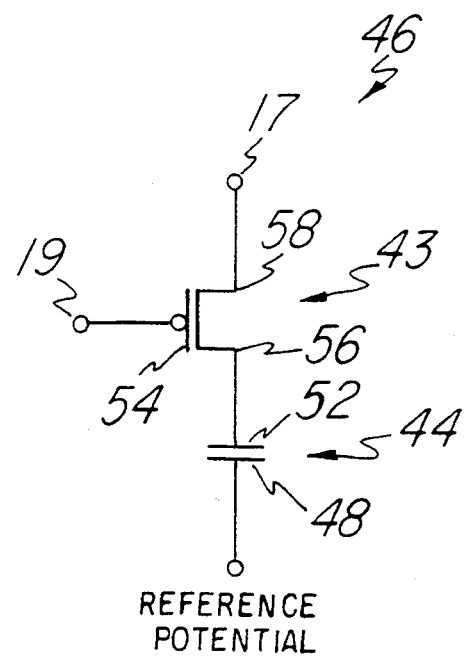
FIG. 7 is an electrical schematic diagram of a memory cell.

FIG. 7 is an electrical schematic diagram showing the electrical operation of transfer transistor 43 and trench capacitor 44. When data is to be stored on memory cell 46, the data, 3.3 v or 0.0 v, is placed on bit line 17 and a high voltage signal (approximately 6 volts) is placed on gate 54. The voltage placed on bit line 17 is passed via source 56 to storage dielectric 52. Field plate 48 is tied to a reference potential of about 1.65 volts and thus a charge representing the voltage applied by bit line 17 is stored on storage dielectric 52. To store the data on storage dielectric 52, the positive voltage is removed from gate 54 thus stopping continuity between source 56 and drain 58.

Figure 8:
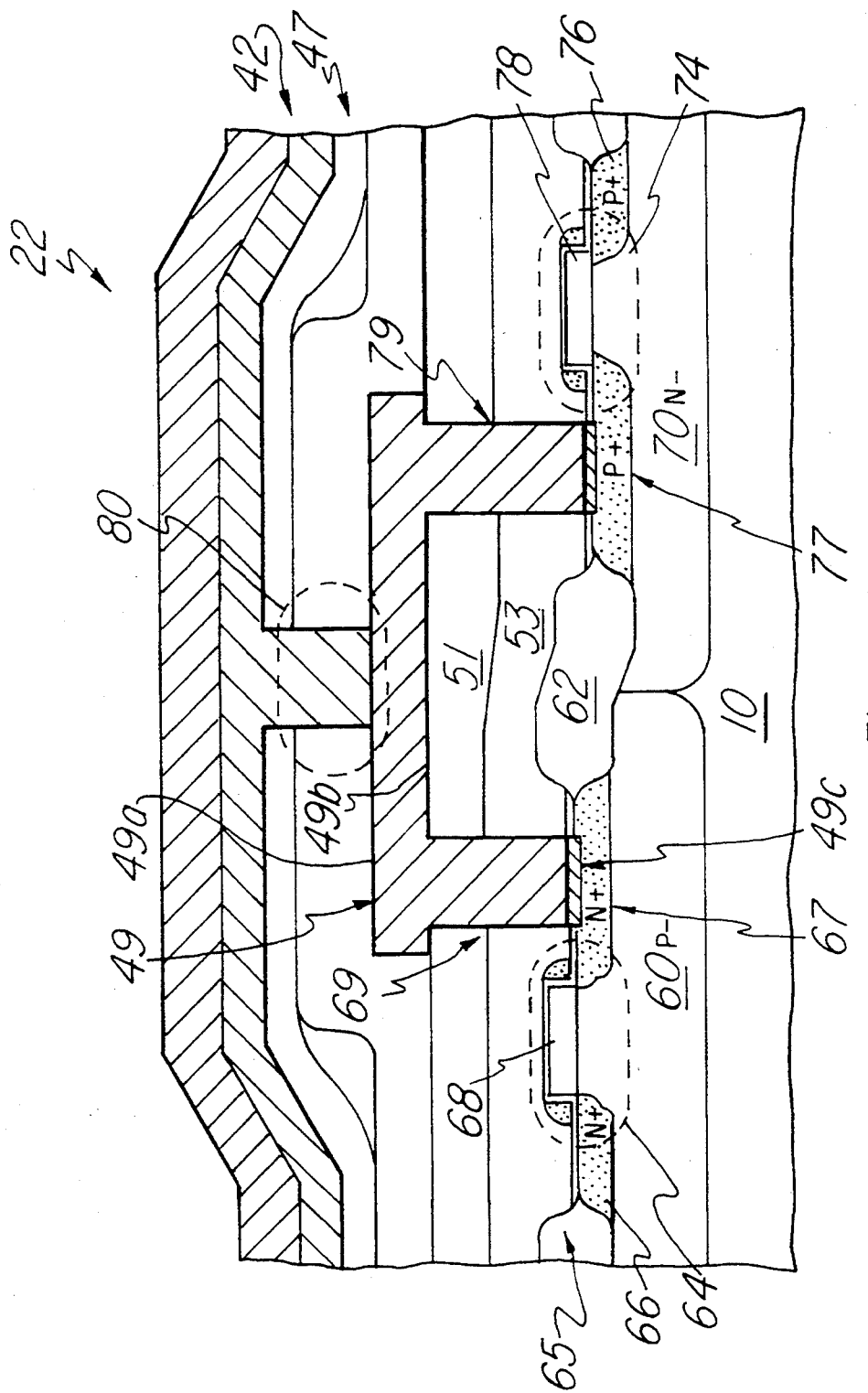
FIG. 8 is a side view of a portion of the peripheral circuitry of the semiconductor integrated circuit device.

Referring now to FIG. 8, a side view of a portion of the peripheral circuitry 22 of DRAM 10 is illustrated. P− tank 60 extends across the semiconductor wafer from memory array 12 to the periphery 22. A field oxide 62 separates the P− tank 60 from the N− tank 70 to form a CMOS inverted moat structure in the periphery. The P− tank 60 is about 3.5 microns and the N− tank 70 is about 2.5 microns deep. P-tank 60 contains a n-channel transistor 64 having an N+ diffusion 65 that forms the source 66 and the drain 67. The gate 68 of n-channel transistor 64 is polysilicon. The drain 67 is connected to metal layer 49 at contact 69. N-tank 70 contains an p-channel transistor 74 having a P+ diffusion 75 that forms the source 76 and the drain 77. The gate 78 of p-channel transistor 74 is polysilicon. The drain 77 connects to layer 49 at contact 79. Metal layer 49 connects to metal layer 42 at contact 80.

Figure 9:
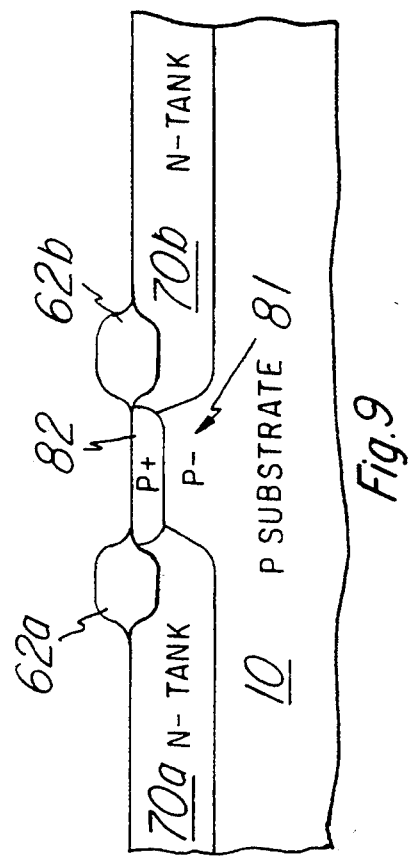
FIG. 9 is a side view of another portion of the peripheral circuitry illustrating the blocking mechanism of the invention.

FIG. 9 depicts a portion of the peripheral circuitry 22 of the DRAM illustrating the preferred embodiment of the blocking mechanism of the invention. With reference to FIG. 8, the structure of FIG. 9 lies within the N− tank 70 farther away from the P and N tank inverse moat. A P− tank 81 lies within N− Tank 70, creating N- well 70a and N− well 70b. P− tank 81 provides isolation to circuits, not shown, formed in N− well 70a and N− well 70b. At the top of P− tank 81, lies blocking mechanism 82. Blocking mechanism 82 in the preferred embodiment is a P+ doped region. It lies between the two N− wells 70a and 70b at the top of P− tank 81. It acts as a channel stop between the two deep N— wells. It extends into the P— tank 81 silicon about 300 angstroms deep. If the N— wells and the P— tank are deeper, the P+doped region 82 may also extend deeper in order to provide an effective blocking mechanism. Field oxide 62a lies at the top of N— well 70a to one side of P+ block 82 and field oxide 62b lies at the top of N— well 70b to the other side of P+ block 82. In application, the N wells 70a and 70b will be biased at different potentials and the P+ diffusion will be floating. For example, N well 70a may be biased at +5 volts and N well 70b may be biased at ground potential. As will be later described, phosphorus may be diffused to dope the N— tank 70. Boron may be diffused to dope the P+channel stop 82 at the top of the P— tank 81. Channel stop 82 reduces potential shorting between N wells 70a and 70b. The boron dopant in P+ channel stop 82 prevents the phosphorus dopant in N— wells 70a and 70b from laterally diffusing across the top of the P— tank 81 and shorting the two N— wells together.

Figure 10:
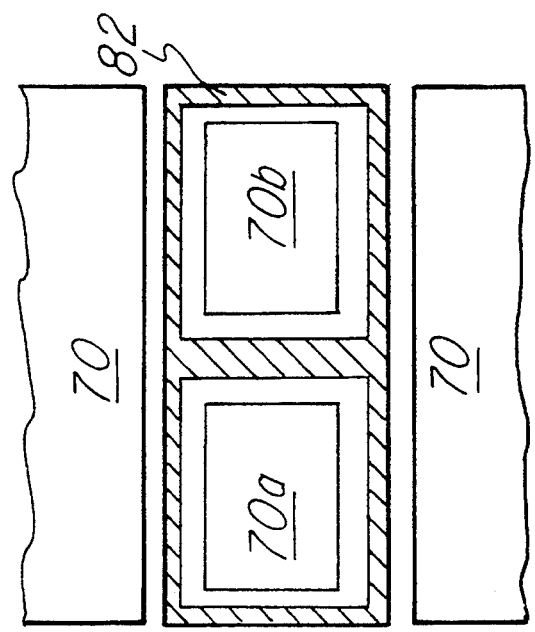
FIG. 10 is a top view of a portion of the peripheral circuitry illustrating the P+ ring around deep N wells.

FIG. 10 is a top view of a P+ channel stop region 82 isolating the two N— deep wells 70a and 70b. P+ doped blocking mechanism surrounds N— wells 70a and 70b.

FIGS. 11a–11h represent resulting structures obtained from initial process flow steps in practicing the invention. The invention may be used in manufacturing the DRAM of FIG. 1. FIG. 11i represents the results of a subsequent process flow step used in practicing the invention. In manufacturing the DRAM, other process steps, not illustrated, occur between FIG. 11h and FIG. 11i. Previously referenced U.S. Pat. No. 5,017,506 issued to Shen, Yashiro, McKee, and Chung, assigned to Texas Instruments Incorporated, describes such suitable non illustrated steps. The patent also describes steps suitable to complete processing of a CMOS DRAM. An important aspect of the inventive process is that it does not add extra steps into a CMOS process flow. A CMOS process flow need not be complicated by adding additional steps in order to practice the invention.

FIGS. 11a–11h are side views of a semiconductor surface illustrating successive stages in practicing the invention thereon by a CMOS process used to create a P+ channel stop region 82 between two N tanks.

Figure 11A:
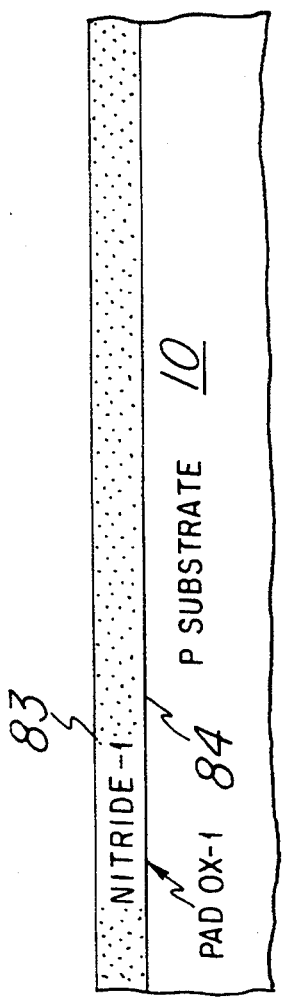

FIG. 11a depicts the resulting structure following the steps of forming a pad oxide-1 layer 84 and a nitride-1 layer 83 on semiconductor wafer 10 having a P substrate. Pad oxide-1 layer 84 acts as a buffer layer between the silicon substrate 10 and the nitride-1 layer 83. It prevents crystal defects during tank oxidation and also provides an etch stop for nitride-1 etches. It may be grown by steam oxidation to a thickness of about 430 Å over the surface of semiconductor substrate 10. Nitride-1 layer 83 may be deposited over pad oxide-1 layer 84 to a thickness of about 1300 Å to prevent growth of tank oxide.

Figure 11B:
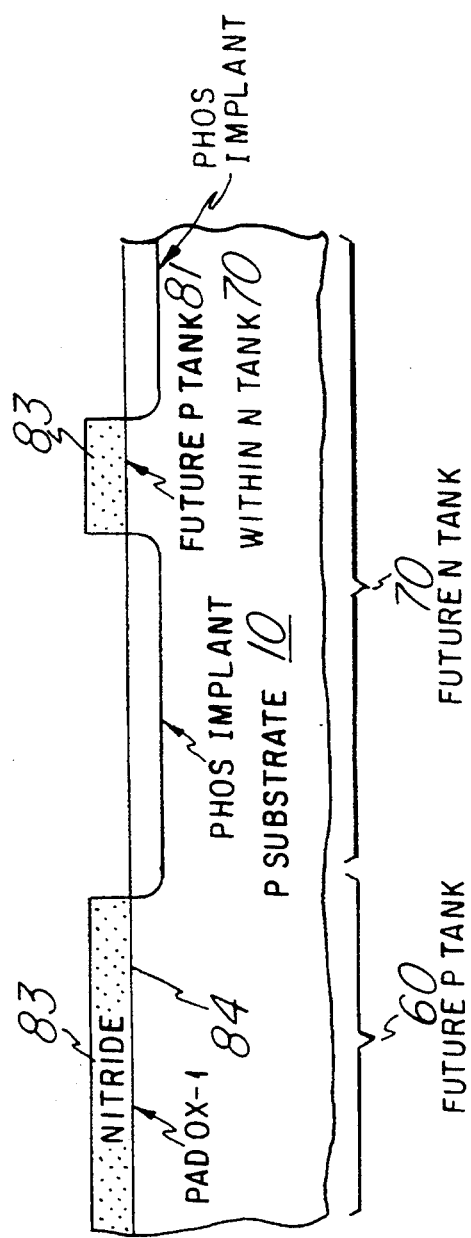

FIG. 11b illustrates the resulting structure following the tank pattern step, tank nitride etch step, and N— tank implant step. A tank pattern step of coating, exposing, and developing a photo resist applies a pattern for etching the nitride-1 layer to expose an N tank area. The tank nitride etch step etches the pattern to remove the nitride-1 layer 83 from the area of the semiconductor substrate where the N— tank 70 will be created. The tank pattern step is applied so that this etch step does not remove the nitride-1 layer 83 within the N tank area where the P— tanks 81 will be created. Etching with $SF_6$/He at about 250 mtorr is sufficient to open the future N tank 70. An N— tank implant step dopes the P substrate 10 within the future N— tank area. Phosphorous may be implanted through pad oxide-1 layer 84 to dope P substrate 10 within the future N tank area. About $1.0E13/cm^2$ phosphorous at about 150 KeV is sufficient to dope the P substrate within the future N— tank area. The nitride-1 layer 83 and resist over the future P tank 81 within the future N— tank 70 prevents the underlying substrate from becoming doped with phosphorus. The resist pattern is then removed.

FIG. 11c illustrates the resulting structure following a tank oxide step. This step forms a self-aligned oxide mask to prevent a later P— tank 60 diffusion step from also doping the N— tank 70. About 4500 Å of tank oxide 85 is grown over the N— tank 70 by steam oxidation. The tank oxide 85 does not grow over the future P— tank 81 region within N tank 70 because the region is covered by the nitride layer 83.

FIG. 11d depicts the structure following a tank etch step and a P— tank diffusion step. The tank etch step strips the nitride-1 layer 83 from the substrate. A deglaze in 1% HF for about 600 seconds followed by a hot megasonic $H_3PO_4$ removes the nitride-1 layer 83. This step removes nitride layer 82 from the substrate in future P— tank 60 and future P— tank 81. The trench capacitors of the DRAM are formed in the P— tank 60 region. A P— tank diffusion step increases boron concentration in the P— tank 60 region to help control trench leakage and latchup. Boron is implanted through the pad oxide-1 layer over the P— tank region at about $6.0E12/cm^2$ @50 KeV. At the same time, this step also implants boron into the future P— tank 81 to create a P— diffusion.

FIG. 11e shows the structure following a tank drive step. The tank drive step activates and diffuses the atoms from the P tank implant step and the N tank implant step deep into the P substrate 10. A high temperature anneal and drive with $N_2$, at approximately 1100° C. for about 1000 minutes works well to diffuse the atoms into substrate 10. The pattern of the process is such that P— tank 81 surrounds areas within N— tank 70. These areas are referred to as N— wells. FIG. 11e clearly shows the P— tank 60, the N— tank 70, and the P— tank 81 lying within N— tank 70 between N— wells 70a and 70b. Following this step, all remaining pad oxide-1 layer 84 and tank oxide 85 is removed from the semiconductor substrate.

FIG. 11f shows the resulting peripheral structure following the formation of a layer of pad oxide-2 and a layer of nitride-2. Pad oxide-2 layer 87 acts as a buffer layer between the silicon semiconductor substrate 10 and nitride-2 layer 86. It prevents crystal defects, minimizes moat encroachment bird's beak formation during field oxide growth, and provides an etch stop for nitride-2 etches. About 230 Å of oxide 87 may be grown over the semiconductor surface by steam oxidation. About 1300 Å of nitride-2 layer 86 may be deposited to prevent long oxide growth.

Figure 11G:
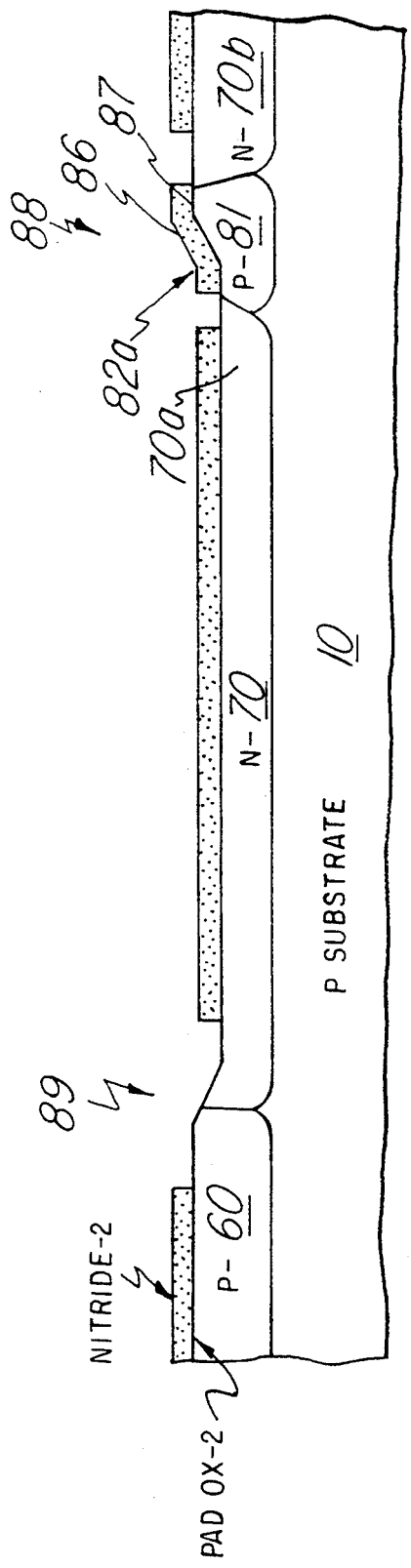

FIG. 11g shows the semiconductor structure with an inverse moat region 89 formed between P— tank 60 and N— tank 70 and an inverse moat region 88 formed within N— tank 70 over P— tank 81. Inverse moat region 89 separates the memory array from the periphery. Inverse moat region 88 separates N well regions 70a and 70b. Field oxide 62 is later formed in moat region 87. P+ channel stop 82 and field oxides 62a and 62b are later formed in inverse moat region 88. An moat pattern step simultaneously applies the pattern for the inverse moat region 89 and the inverse moat regions 88.

However, the moat pattern for the inverse region 88 is different than the moat pattern for moat region 89. Since the P+ channel stop 82 lies between field oxide 62a and 62b, the moat pattern step covers part of the nitride-2 layer 86 within an area 82a of inverse moat region 88. The P+ blocking mechanism 82 will later be formed in area 82a of inverse moat region 88. A photo resist is applied, exposed and developed to create the moat patterns. Then a plasma etch step etches the inverse moat patterns. A SF$_6$/He etch at about 250 mtorr is sufficient to strip away the nitride-2. However, as FIG. 11g indicates, the nitride-2 layer within region 82a of the inverse moat region 88 is not removed. The pattern leaves resist over area 82a so that the nitride-2 is not etched away during the plasma etch step. Leaving region 82a protected by nitride-2 layer 86 prevents field oxides 62a and 62b from being grown over the area within the inverse moat upon which P+ channel stop 82 will be formed. Following the etching step, the resist is removed.

Figure 11H:
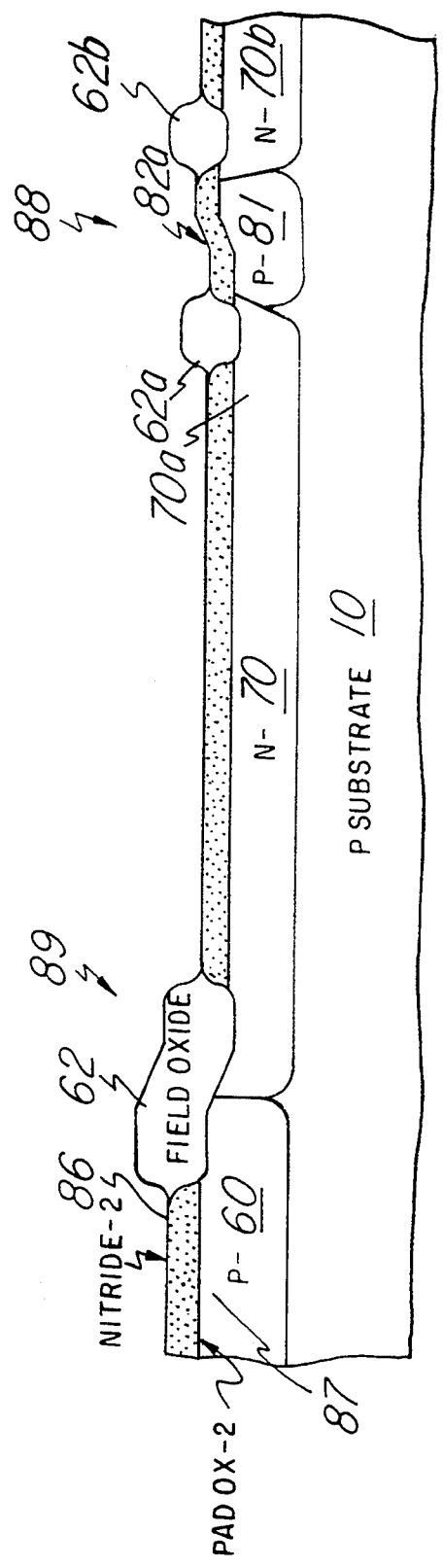
Figure 11I:
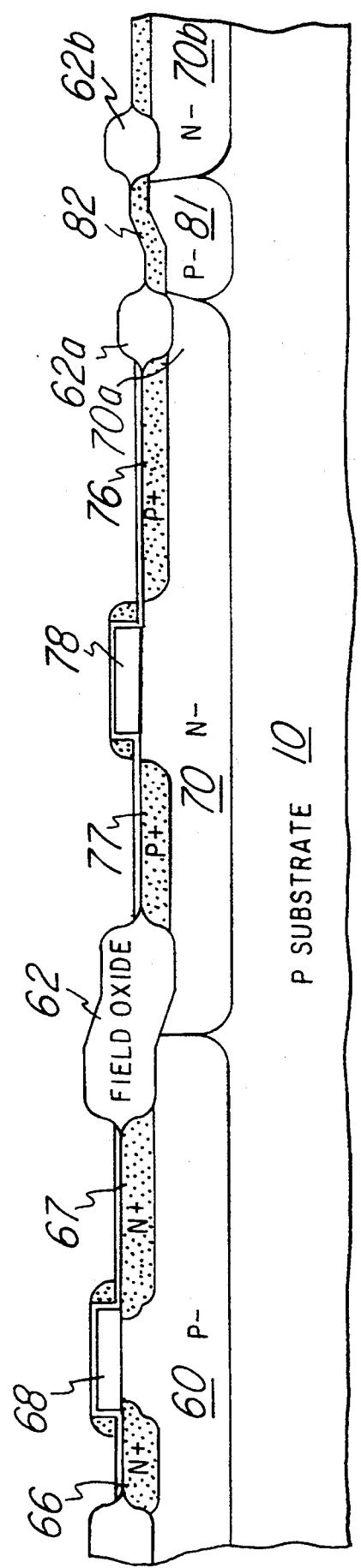

FIG. 11h reveals the resulting structure following a long oxide step to form the field oxide. The field oxide helps provide electrical isolation for transistors and diffused conductors in the periphery. Steam oxidation at about 8 atm, 920° C. grows about 6200 Å of field oxide 62 in moat region 89 between P tank 60 and N tank 70. This step also forms field oxides 62a and 62b within inverse moat region 88 on either side of region 82a that is protected by nitride-2 layer 86.

Following the long oxide step, a moat etch step strips away nitride-2 layer 86 from the semiconductor wafer. This removes nitride layer 86 from area 82a. The development of the DRAM further continues with other process steps, as previously indicated.

FIG. 11i reveals the resulting peripheral structure following the formation of the P+ diffusion 75 in the periphery. As previously described, the P+ diffusion 75 is used forming the source 76 and the drain 77 of the p-channel transistors in the periphery as illustrated in FIG. 8. The P+ diffusion is also used to form the P+ channel stop 80. A P+ pattern step of coating, exposing, and developing a resist applies a pattern for forming the P+ diffusions over the periphery. A bake step hardens the resist and prevents resist burn during the high dose source/drain implant step. Low resistivity and shallow P+ source/drain diffusions are formed in the periphery by implanting boron at about 3.0E15/cm$^2$ @20 KeV. This diffusion step simultaneously implants boron into region 82a of inverse moat region 88 between field oxides 62a and 62b and thus forms P+ channel stop 82. P+ channel stop 82 lies at the top of P− tank 81 that separates N− wells 70a and 70b.

The manufacturing of the DRAM thereafter further continues to completion with additional process steps as previously indicated.

The invention solves the problem of phosphorous surface piling up in a P− well type region between highly doped N− well regions. The P+ junction 82 is essentially the same as the P+ junction of all the transistors in the periphery and comprises heavily doped boron. Although there will be some phosphorus pile up at the top of the P− type regions, due to the growth of the field oxide on either side of the P+ blocking region, if enough P+ dopant is diffused, it counter acts the phosphorous pile up. The heavily dosed P+ region cuts off leakage between the N tanks through the top of the P− channel field effect transistor and prevents the two N tanks from shorting together.

The P+ channel isolation region prevents degradation of the P-type field transistors in high temperature deep tank drive and highly doped N− well cases. It reduces degradation of N− tank to N− tank isolation. It does not incorporate extra process steps in a CMOS process and yields a simple structure.

As field isolation spacing shrinks in order to save layout area and as transistor designs continue to shrink to smaller submicron dimensions (less than 0.3 microns), the P+ channel stop for the P− channel device between deep N wells will provide a secure isolation between the deep N wells.

The inventive process will work in shallow tank devices as well as in deep tank devices, although the invention has particular usefulness in deep tank devices. Transistor voltage thresholds need to be uniform regardless if the device is a shallow tank device or a deep tank device. A constant surface concentration of dopant is needed across a semiconductor wafer to provide uniform threshold voltages. It typically takes more dopant for deep tanks than for shallow tanks because some of the dopant must be driven deeper into the substrate in order to have a constant threshold voltage. However, increasing the surface dopant concentration may lower the voltage threshold, Vt. The inventive process eliminates the necessity of putting extra dopant into the surface of deep N tank devices prior to the growth of field oxide and running the risk of adversely affecting Vt.

The invention also eliminates the necessity of an extra pattern to avoid P− channel like field transistor effects and eliminates a high energy implant step, such as about 150 KeV, through the field oxide. The invention takes advantage of the CMOS process flow without adding additional steps. The inverse moat is formed when the inverse moat between the P tank and the N tank is formed; the oxide spacers are formed when the field oxide over the inverse moat between the P tank and N tank is formed; and, the P+ channel stop in the inverse moat is formed when the P+ source/drain junctions for the transistors in the periphery are formed.

Although described in relation ship to a DRAM, the invention is not limited to DRAMs or memory devices. The invention has broad applicability general CMOS process technology. Examples of other devices benefitting from the inventive structure and process include, but are not limited to, logic devices, microprocessors, and controllers manufactured as CMOS devices.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of making a channel stop to prevent phosphorous surface pile up in a semiconductor substrate having a boron doped P− type region located between phosphorous doped, adjacent N− type tank regions, comprising the steps of:

forming oxide isolators in the surface of the semiconductor substrate surrounding the N− type tank regions, said oxide isolators do not completely cover the p− type region located between the phosphorous doped, adjacent N− tank regions, thereby leaving a p⁻ type channel region between said oxide isolators; and forming a P+ region in the surface of the semiconductor substrate in the P− type channel region extending between the oxide isolators.

2. The method of claim 1 wherein the P+ region is formed by implanting boron into the P− type region between the oxide isolators.

3. The method of claim 2 wherein the oxide isolators are formed by growing them.

4. A process of making a CMOS device, comprising the steps of:

forming a P− tank region and a plurality of N− tank regions in a P type semiconductor substrate, wherein said plurality of N− tank regions are surrounded by P− tank regions;

forming oxide isolators in the surface of said semiconductor substrate, wherein the oxide isolators do not completely cover the P− tank regions located between adjacent N− tank regions, and wherein a P− channel region is left between oxide isolators surrounding adjacent N− tank regions, thereby further isolating the N− tank regions from adjacent N− tank regions; and forming sources and drains for transistors within the plurality of N− tank regions.

5. The process of making the CMOS device of claim 4 further comprising the step of:

forming a P+ region within the channel regions between adjacent N− tank regions, simultaneous with the formation of the sources and the drains for the transistors within the plurality of N− tank regions, said P+ region extending between oxide isolators surrounding adjacent N− tank regions.

6. The process of claim 5 wherein the steps of forming the P− tank region and the plurality of N− tank regions and creating the channel region separating adjacent N− tank regions, comprise the steps of:

implanting phosphorous into said semiconductor substrate for formation of the plurality of N− tank regions;

implanting boron into said semiconductor substrate for formation of the P− tank region; and diffusing the implanted phosphorous and the implanted boron.

7. The process of claim 6 wherein the step of forming the P+ region within the channel region comprises implanting boron into the channel region.

* * * * *